US010896833B2

(12) United States Patent
Kommisetti et al.

(10) Patent No.: US 10,896,833 B2
(45) Date of Patent: Jan. 19, 2021

(54) METHODS AND APPARATUS FOR DETECTING AN ENDPOINT OF A SEASONING PROCESS

(71) Applicant: Applied Materials, Inc., Santa Clara, CA (US)

(72) Inventors: Subrahmanyam Venkata Rama Kommisetti, Singapore (SG); Eda Tuncel, Menlo Park, CA (US); Shayne Smith, Pflugerville, TX (US); Liming Zhang, San Jose, CA (US); Sathyendra Ghantasala, Fremont, CA (US); Ryan Patz, Swampcott, MA (US)

(73) Assignee: Applied Materials, Inc., Santa Clara, CA (US)

( * ) Notice: Subject to any disclaimer, the term of this patent is extended or adjusted under 35 U.S.C. 154(b) by 151 days.

(21) Appl. No.: 16/403,104

(22) Filed: May 3, 2019

(65) Prior Publication Data

US 2019/0348312 A1    Nov. 14, 2019

Related U.S. Application Data

(60) Provisional application No. 62/669,148, filed on May 9, 2018.

(51) Int. Cl.
*H01L 21/67* (2006.01)
*G05B 19/418* (2006.01)
(Continued)

(52) U.S. Cl.
CPC .... *H01L 21/67276* (2013.01); *G05B 13/0265* (2013.01); *G05B 19/41875* (2013.01);
(Continued)

(58) Field of Classification Search
CPC . G06T 7/60; G06T 7/001; G06K 9/52; H04N 5/225; H01L 21/67276; G05B 13/0265; G05B 19/41875
See application file for complete search history.

(56) References Cited

U.S. PATENT DOCUMENTS 5,963,840 A    10/1999  Xia et al.
6,081,334 A     6/2000  Grimbergen et al.
(Continued)

OTHER PUBLICATIONS

International Search Report and Written Opinion dated Aug. 14, 2019 for Application No. PCT/US2019/031007.

*Primary Examiner* — Seahvosh Nikmanesh
(74) *Attorney, Agent, or Firm* — Patterson + Sheridan, LLP

(57) ABSTRACT

A method for detecting an endpoint of a seasoning process in a process chamber includes obtaining seasoning progress data indicating a progress of the seasoning process for each substrate of a first plurality of substrates, and collecting historical parameter values from a plurality of sensors disposed in the process chamber. The historical parameter values for each substrate of the first plurality of substrates are normalized with respect to a plurality of parameter values for a particular substrate in the first plurality of substrates. An MVA model is generated by applying a set of coefficients to the normalized parameter values for each substrate of the first plurality of substrates, and the set of coefficients are regressed based on the seasoning progress data. An end point of the seasoning process is determined using the MVA model with a plurality of substantially real-time parameter values measured when performing a seasoning process over each substrate of a second plurality of substrates.

20 Claims, 5 Drawing Sheets

(51) Int. Cl.
  *G05B 13/02* (2006.01)
  *G06Q 10/06* (2012.01)
  *G06K 9/52* (2006.01)
  *G06T 7/00* (2017.01)

(52) U.S. Cl.
  CPC .............. *G06K 9/52* (2013.01); *G06Q 10/06* (2013.01); *G06T 7/001* (2013.01); *G05B 2219/45031* (2013.01)

(56) References Cited

U.S. PATENT DOCUMENTS

| | | |
|---|---|---|
| 6,745,095 B1 | 6/2004 | Ben-Dov et al. |
| 2005/0146709 A1 | 7/2005 | Oh et al. |
| 2005/0165731 A1* | 7/2005 | Funk ...................... G05B 15/02 |
| 2005/0171627 A1* | 8/2005 | Funk ................. H01L 21/67253 700/121 |
| 2005/0187649 A1* | 8/2005 | Funk ................. G05B 19/4184 700/121 |
| 2006/0151429 A1 | 7/2006 | Kitsunai et al. |
| 2009/0037013 A1* | 2/2009 | Hendler ........... G05B 19/41875 700/103 |
| 2010/0332010 A1 | 12/2010 | Choi et al. |
| 2012/0041584 A1 | 2/2012 | Park et al. |
| 2015/0020970 A1 | 1/2015 | Ikegami et al. |
| 2020/0006100 A1* | 1/2020 | Clark ...................... H01L 22/12 |
| 2020/0083080 A1* | 3/2020 | Clark ................ H01L 21/76831 |

* cited by examiner

METHODS AND APPARATUS FOR DETECTING AN ENDPOINT OF A SEASONING PROCESS

CROSS REFERENCE TO RELATED APPLICATIONS

This application claims benefit of U.S. Provisional Patent Application No. 62/669,148, filed May 9, 2018, which is herein incorporated by reference.

FIELD

The present application relates to methods and apparatus for detecting an endpoint of a seasoning process in a process chamber.

DESCRIPTION OF THE RELATED ART

Semiconductor device fabrication includes a series of processes that produce electrical circuits in a semiconductor, e.g., a silicon substrate, in accordance with a circuit design. Many fabrication processes, such as deposition or etching, are performed in a process chamber, such as a chemical vapor deposition (CVD) chamber. An efficient, non-damaging cleaning of the process chamber is important for smooth operation of the processes as well as improved device yield and better product performance. Thus, periodic chamber maintenance is needed to improve performance of a chamber for producing high quality semiconductor devices.

After such chamber maintenance, a seasoning process is necessary to restore a chamber condition to be suitable for substrate fabrication processes before resuming normal production processes. As processes are performed in the process chamber, material is gradually deposited on interior surfaces of the chamber. This can result in drift of process variables until the entire interior surface has material deposited thereon. Thus, there is a need for a technique to detect an endpoint of the seasoning process to identify when to stop the seasoning process and when production processes can resume in the process chamber.

SUMMARY

The present disclosure provides methods and apparatus for detecting an endpoint of a seasoning process in a process chamber.

In one embodiment, an apparatus for detecting an end point of a seasoning process in a process chamber may include a process chamber, a set of sensors coupled to the process chamber, at least one storage configured to store seasoning data indicating a progress of a past seasoning process for each substrate of a first plurality of substrates, and historical parameter values measured from a plurality of sensors selected from the set of sensors during the past seasoning process performed over each substrate of the first plurality of substrates. The apparatus may further include a controller configured to normalize the historical parameter values for each substrate of the first plurality of substrates with respect to a plurality of parameter values for a particular substrate of the first plurality of substrates. The controller may also be configured to generate a multi-variate analysis (MVA) model by applying a set of coefficients to the normalized historical parameter values for each substrate of the first plurality of substrates, and determine the set of coefficients by performing a regression operation on output values of a logistic equation. Inputs of the logistic equation are outputs of the MVA model with the normalized historical parameter values for each substrate of the first plurality of substrates. The controller may be further configured to receive a plurality of substantially real-time parameter values from the plurality of sensors when processing a second plurality of substrates, and determine an end point of the seasoning process using the MVA model with the plurality of substantially real-time parameter values.

In another embodiment, a method for detecting an endpoint of a seasoning process in a process chamber may include obtaining seasoning progress data indicating a progress of a past seasoning process for each substrate of a first plurality of substrates, obtaining historical parameter values measured from a plurality of sensors selected from a set of sensors coupled to a process chamber during the past seasoning process performed over each substrate of the first plurality of substrates. The method may also include normalizing the historical parameter values for each substrate of the first plurality of substrates with respect to a plurality of parameter values for a particular substrate of the first plurality of substrates, generating a multi-variate analysis (MVA) model by applying a set of coefficients to the normalized historical parameter values for each substrate of the first plurality of substrates, and determining the set of coefficients by performing a regression operation on outputs of a logistic equation. Inputs of the logistic equation are outputs of the MVA model with the normalized historical parameter values for each substrate of the first plurality of substrates. The method may further include receiving a plurality of substantially real-time parameter values from the plurality of sensors when processing each substrate of a second plurality of substrates, and determining an end point of the seasoning process using the MVA model with the plurality of substantially real-time parameter values.

In yet another embodiment, a method for detecting an endpoint of a seasoning process is provided. The method includes obtaining seasoning progress data indicating a progress of a seasoning process for each substrate of a first plurality of substrates. The method may also include obtaining historical parameter values measured from a subset of a plurality of sensors coupled to a process chamber, each sensor in the plurality of sensors measuring a parameter of the seasoning process when processing each substrate of the first plurality of substrates. The method may also include normalizing the historical parameter values with respect to a subset of the historical parameter values associated with a particular substrate of the first plurality of substrates. The method may also include normalizing the seasoning progress data for each substrate of the first plurality of substrates with respect to seasoning progress data associated with a completed seasoning process. The method may also include generating a multi-variate analysis (MVA) model by applying a coefficient to each normalized historical parameter values for the first plurality of substrates, wherein the coefficients are determined by performing a regression operation on a plurality of outputs of a logistic equation, where inputs of the logistic equation are outputs of the MVA model. The method may also include receiving a plurality of substantially real-time parameter values from the subset of sensors when processing each substrate of a second plurality of substrates. The method may also include determining an end point of the seasoning process using the MVA model with the plurality of substantially real-time parameter values.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
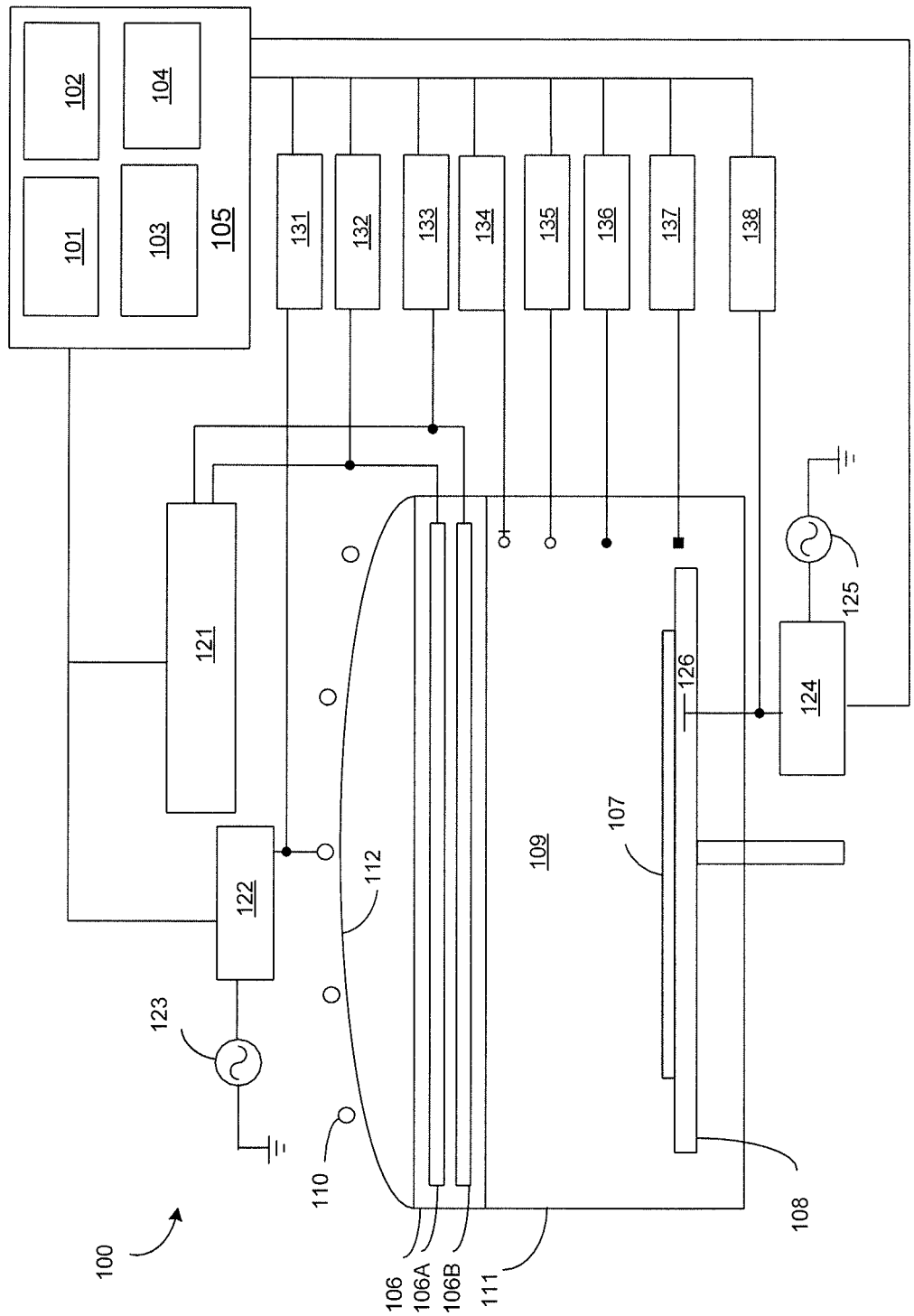
FIG. 1 is a schematic cross-sectional view of a process chamber in accordance with aspects of the present disclosure.

FIG. 1 is a schematic cross-sectional view of a process chamber 100 according to one aspect of the present disclosure. The process chamber 100 includes a chamber body 111, a dielectric dome 112, a chemical delivery module 121, a first RF match 122, a second RF match 124, and a plurality of sensors 131-138.

The dielectric dome 112 is adjacent to a showerhead assembly 106. A process volume 109 is at least partially defined by the chamber body 111 and the dielectric dome 112. A substrate support 108 is disposed in the process volume 109. The showerhead assembly 106 is disposed in the process volume 109 opposite the substrate support 108. The showerhead assembly 106 includes multiple processing gas channels including a first gas channel 106A and a second gas channel 106B. One or more process gases are delivered to the process volume 109 through the first gas channel 106A and the second gas channel 106B, independently. One or more openings (not shown) formed through the showerhead fluidly connect the first gas channel 106A and the second gas channel 106B to the process volume 109.

The chemical delivery module 121 delivers various process gases to the first process gas channel 106A and the second process gas channel 106B from one or more gas sources (not shown). The various process gases may include a precursor gas, a carrier gas, and/or a purge gas for a deposition process or an etching process.

The first RF match circuit 122 is coupled to a Radio Frequency (RF) power source 123 of, e.g., 12.56 MHz, and supplies RF (or AC) power to an inductive coil 110 to activate a process gas in the process volume 109 and generate a high-density plasma therein. A second RF match circuit 124 is coupled with a bias power source 125 of, e.g., 13.56 MHz, and supplies RF (or AC) power to a cathode 126 disposed in the substrate support 108. The second RF match circuit 124 controls ion bombardment energy delivered to a substrate 107 disposed on the substrate support 108. In some embodiments, the substrate 107 is a silicon substrate used for semiconductor device fabrication.

In some embodiments, the cathode 126 is part of an electrostatic chuck (not shown) embedded within the substrate support 108. The electrostatic chuck can be thermally controlled during an etching process using a gas, such as helium, to cool the electrostatic chuck and the substrate 107. The RF (or AC) power supplied to the inductive coil 110 and to the cathode 126 may vary depending on particular applications.

The plurality of sensors 131-138 may include one or more of a voltage and/or current probe (or VI probe), an optical sensor, a temperature sensor, a pressure sensor, gas sensor, and other sensors at suitable locations in the process chamber 100. The sensors 131-138 measure electrical, mechanical, and/or chemical parameters pertinent to the operation of the process chamber 100.

For example, the sensor 131 is a VI probe for sensing a voltage and/or current at the inductive coil 110. The sensors 132 and 133 are flow sensors for measuring flow rates inside each of the first gas channel 106A and the second gas channel 106B. The sensor 134 is an optical spectrometer for detecting a plurality of spectral bands for measuring a temperature of the plasma or the substrate 107. The sensor 135 is a pressure sensor for measuring a pressure in the process chamber 100. The sensor 136 is a temperature sensor for measuring a temperature inside the process chamber 100. The sensor 137 is a gas sensor for measuring a concentration (or density) of a gas in the process volume 109. In one embodiment, which can be combined with one or more embodiments described above, the sensor 137 is an oxygen sensor for measuring a concentration of oxygen in the process chamber 100. An adjustment of oxygen over time can be calculated based on the measured concentration of oxygen. The sensor 138 is another VI probe for measuring a voltage and/or current at the cathode 126. Many other sensors can be deployed at suitable locations in the process chamber 100 to measure parameters needed to identify a status of the process chamber 100 during an operation thereof.

The process chamber 100 includes a controller 105 to control aspects of the process chamber 100 during plasma processing. The controller 105 comprises a central processing unit (CPU) 101, a memory 102, and support circuits 103 for the CPU 101. The controller 105 is coupled to and facilitates control of the various components and operation of the process chamber 100. For example, the controller 105, as shown, is coupled to the sensors 131-138, the chemical delivery module 121, the first RF match circuit 122, and the second RF match circuit 124. The controller 105 may be one of any form of general-purpose computer that can be used in an industrial setting for controlling various chambers and sub-processors. The memory 102 stores software (source or object code) that may be executed or invoked to control the overall operations of the process chamber 100 in manners described herein. The controller 105 may also include a storage 104 where measurements from the various sensors 131-138 are stored. The stored measurements may include historical values of parameters for various processes performed in the process chamber 100.

The controller 105 manipulates operations of controllable components in the process chamber 100. For example, the controller 105 may select and activate different groups of the plurality of sensors 131-138 for different types of processes performed in the process chamber 100, such as a seasoning process and/or a production process, such as deposition or etching. The controller 105 may receive signals from the activated sensors to monitor various parameters of the processes performed.

Examples of the process chamber 100 can include chemical vapor deposition (CVD) chambers such as AKT® PECVD chambers, PRODUCER™ chambers, and PRECISION 5000® chambers commercially available from Applied Materials Inc., Santa Clara, Calif.

Figure 2A:
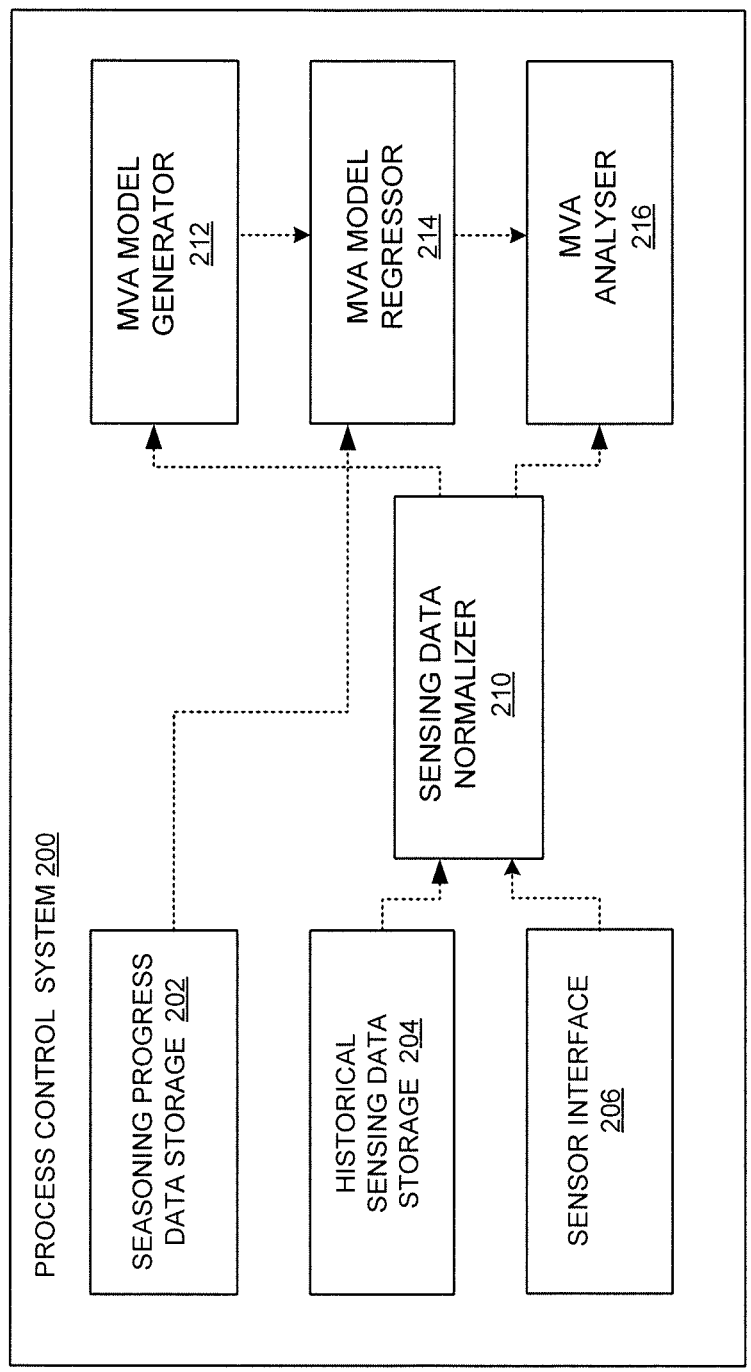
FIG. 2A is a schematic block diagram of a process control system for detecting an endpoint of a seasoning process in accordance with aspects of the present disclosure.

FIG. 2A is a schematic block diagram of a process control system 200 for detecting an endpoint of a seasoning process in accordance with aspects of the present disclosure. The process control system 200 may be incorporated into the controller 105 described with respect to FIG. 1, or may be implemented on a computing system separate from the controller 105. The process control system 200 includes seasoning progress data storage 202, historical sensing data storage 204, a sensor interface 206, a sensing data normalizer 210, an MVA model generator 212, an MVA model regressor 214, and an MVA analyzer 216.

Seasoning progress data $\{R_1, R_2, \ldots R_n\}$ is obtained during processing of each substrate of the first plurality of substrates. The seasoning progress data is stored in the seasoning progress data storage 202. The progress data in the seasoning progress data storage 202 may be progress data for previously completed seasoning processes. The seasoning progress data can include any parameter values indicating a progress of the seasoning operation at various times during the processing of each substrate of the first plurality of substrates (e.g., 1, 2, 3, . . . , N). While each substrate is processed, the parameters in the seasoning progress data change as the seasoning process progresses and the process chamber becomes seasoned.

The seasoning progress data in the seasoning progress data storage 202 may be recorded and maintained chronologically, or with reference to a time stamp. This enables the progress data to be analyzed sequentially to estimate an endpoint of the seasoning process at which the process chamber is fully seasoned. As an example, in a case where the process chamber performs an etch process, the seasoning progress data for each substrate can include an etch rate indicating a rate at which a material is removed from a surface of a substrate. The etch rate can be measured, for example, by measuring an amount of material etched for a period of time.

In another example, the seasoning progress data may also include an etch selectivity indicating a ratio of etch rates between two materials under the same conditions, and/or an undercut factor indicating the lateral extent of an etching under a etch mask. The etch selectivity can be measured, for example, by etching two overlapped layers and measuring a thickness of the lower layer after being etched. The undercut factor can be measured, for example, by placing a resist layer over an etched structure of a length L and a width W, and measuring a signal related to a resistance change on the resist layer.

In yet another example, the seasoning progress data may include concentrations of oxygen ($O_2$), or nitrogen ($N_2$) or another gas, in the process chamber during the seasoning process. The seasoning progress data storage 202 can store progress data for many seasoning processes. For example, progress data for more than ten (10) seasoning processes performed during a prior three month period may be stored in the seasoning progress data storage 202.

In one embodiment, which can be combined with one or more embodiments described above, the seasoning progress data for each substrate processed during the seasoning process may be normalized with respect to data obtained after the seasoning process has completed (i.e., after the chamber is seasoned). For example, in a seasoning process for an etch chamber, where a measured etch rate while processing a third substrate is 3.0 Å/minute and a measured etch rate when the process chamber is fully seasoned (e.g., while processing a twentieth substrate) is 10.0 Å/minute. In such case, the normalized seasoning progress data for the third substrate is 0.3 (=3/10).

In another embodiment, which can be combined with one or more embodiments described above, the process chamber can be considered fully seasoned when a measured oxygen ($O_2$) adjustment in the process chamber is a less than a predetermined threshold. In that case, the measured oxygen ($O_2$) adjustment can be normalized with respect to the threshold. For example, when an oxygen ($O_2$) adjustment measured during seasoning of the third substrate is 0.9 sccm and a threshold is 0.5 sccm, then the normalized seasoning progress data for the third substrate is 0.8 (=(0.9-0.5)/0.5).

The normalized seasoning progress data indicates how much the process chamber is seasoned for each substrate during a seasoning operation. The normalized seasoning progress data can be used as reference data for determining a set of coefficients via a regression analysis as described below in connection with the MVA model regressor 214. In one embodiment, which can be combined with one or more embodiments described above, the seasoning progress data may be normalized before the data is stored in the seasoning progress data storage 202. In another embodiment, which can be combined with one or more embodiments described above, the seasoning progress data may be stored in in the seasoning progress data storage 202 without being normalized. In that case, the seasoning progress data may be normalized at a later time by the process control system 200.

Historical sensing data storage 204 stores historical parameter values detected from a plurality of sensors installed in the process chamber during operation of the process chamber. To capture historical parameters for a seasoning process, parameter values are obtained by the plurality of sensors during the seasoning process. The parameter values are recorded and stored in the historical sensing data storage 204 in chronological order.

In one embodiment, which can be combined with one or more embodiments described above, each sensor of the plurality of sensors can measure a parameter value at a certain point in time during processing of a particular substrate. For example, each sensor of the plurality of sensors can detect a parameter value at a median time of the process performed on the particular substrate. In another embodiment, which can be combined with one or more embodiments described above, each sensor can detect a parameter value at multiple points in time during processing of the particular substrate. In such a case, a maximum or minimum parameter value, or an average of a parameter value over time can be determined for the particular substrate.

The parameter values for the process performed in the process chamber may include a voltage, an electrical current, a flow rate, spectral data, a temperature, a pressure or many other features associated with a seasoning process. Some parameter values are measured in the process chamber during a seasoning process. Other parameter values are measured outside of, but adjacent to, the process chamber. For example, a voltage, electrical current, or flow rate of a gas may be measured outside of the process chamber.

In one embodiment, which can be combined with one or more embodiments described above, different subsets of the plurality of sensors may be selected and activated for different types of seasoning processes. For example, for an etching process, the process control system 200 can select and activate flow rate sensors for etching gases, such as silicon tetrachloride ($SiCl_4$) gas and chlorine ($Cl_2$) gas. For a deposition process, the process control system 200 can select and activate flow rate sensors for a silicon-containing gas, such as one or more of silanes, halogenated silanes, or organosilanes.

During the seasoning process, a first plurality of substrates is sequentially processed in a process chamber. The first plurality of substrates may be used solely for the seasoning process of the chamber and not for production substrates. Each substrate of the first plurality of substrates is loaded into the process chamber and a predetermined process is performed on the substrate to season the process chamber. The process chamber is considered seasoned when a variance in the measured parameters of the predetermined process have stabilized within a threshold or range.

For example, as the predetermined process is performed, current parameters are measured and compared to previously measured parameters to determine a variance between the current parameters and the previously measured parameters. The variance of each parameter is compared to a predetermined threshold (or range) for the parameter to determine if the parameter has stabilized. For convenience in calculating the variance, parameters of interest can be normalized so that chronological profiles of the parameters can be used simultaneously.

The sensing data normalizer 210 normalizes a plurality of parameters $P_{i,j}$ for each substrate of the first plurality of substrates, where j=1, 2, . . . , M is a particular parameter for the substrate, i=1, 2, . . . , N. Thus, the sensing data normalizer 210 obtains a set of normalized parameter values $x_{i,j}$ for each substrate i=1, 2, . . . , N of the first plurality of substrates. A plurality of parameters $P_{i,j}$ are recorded during processing of each substrate, i=1, 2, . . . , N. One substrate of the first plurality of substrates, substrate A (i.e., i=A), is selected as the basis for normalization of the parameters of each substrate (i=A). The parameters for the selected substrate, $P_{A,j}$, are used to normalize the parameters of all the other substrates in the first plurality of substrates.

In one embodiment, which can be combined with one or more embodiments described above, the sensing data normalizer 210 normalizes the parameters for each of the other substrates (i≠A) by computing $x_{i,j}=[(P_{i,j}-P_{A,j})/P_{A,j}]*100$ for each parameter j of the other substrates, where $x_{i,j}$ is a percentage (%) deviation of the parameters for substrate i with respect to the parameters $P_{A,j}$ of the selected substrate A. That is, each parameter of the other substrates is normalized with respect to the corresponding parameter of selected substrate A.

The selected substrate may be any substrate in the first plurality of substrates processed during the seasoning operation. For example, the selected substrate may be the first, second, third, fourth, or fifth substrate in the first plurality of substrates processed. In one embodiment, which can be combined with one or more embodiments described above, the substrate selected as the basis for normalization is chosen such that all parameter values $P_{A,j}$ for that substrate are non-zero. For example, assume that five different sensors are selected for activation to collect sensing data during a certain seasoning process. That is, five parameter values are recorded for each substrate. Suppose that when processing the second substrate, only four sensors output non-zero values and the fifth sensor outputs values that are substantially zero. Also suppose that when processing the third substrate, all five sensors output non-zero values. In that case, the third substrate may be selected as the basis for the normalization process. Selecting a substrate with all non-zero parameter values avoids a potential problem of dividing by zero when normalizing parameter values of the other substrates.

In the description below, for purposes of explanation, it is assumed that the second substrate is used as the basis for normalization. That is, the sensing data normalizer 210 is described as normalizing the parameter values of each substrate of the first plurality of substrates using the parameter values measured while processing the second substrate. However, as described above, other substrates may be selected as the basis for normalization.

In one embodiment, which can be combined with one or more embodiments described above, the parameter values are normalized by calculating a deviation of the parameter values obtained while processing each substrate of the first plurality of substrates from the parameter values obtained while processing the selected substrate (i.e., the second substrate). For example, if a pressure in the process chamber measured while processing the selected (i.e., second) substrate is 40 Torr and a pressure measured while processing the fifth substrate is 100 Torr, the normalized chamber pressure for the fifth substrate is 2.5 (=100/40).

The MVA model generator 212 generates a multi-variate analysis (MVA) model using the normalized parameter values. In one embodiment, which can be combined with one or more embodiments described above, the MVA model can be a polynomial equation which is obtained by applying a set of coefficients $\{c_{k,j}\}$, k=0, 1, . . . , N, to the normalized parameter values for each substrate. The polynomial equation for the i-th substrate is as follows: $y_i = c_0 + \Sigma_j c_{i,j} x_{i,j}$. The number $y_i$ is thus a linear combination of the parameter values recorded for i-th substrate. In some cases, $y_i$ is a weighted average of the parameter values recorded for substrate i.

The MVA model generator 212 uses the outputs of the polynomial equation, $y_i$, to compute the following logistic equation:

$$S_i = \left(\frac{1}{1+e^{-y_i}} - 0.5\right)*2 \quad (1)$$

where $S_i$ is a seasoning index for the i-th substrate. The seasoning index indicates the progress of the seasoning operation. Consequently, the MVA model generator 212 will output respective seasoning indices for each substrate of the first plurality of substrates, where each seasoning index is a function of a set of coefficients and a set of normalized parameter values.

Figure 2B:
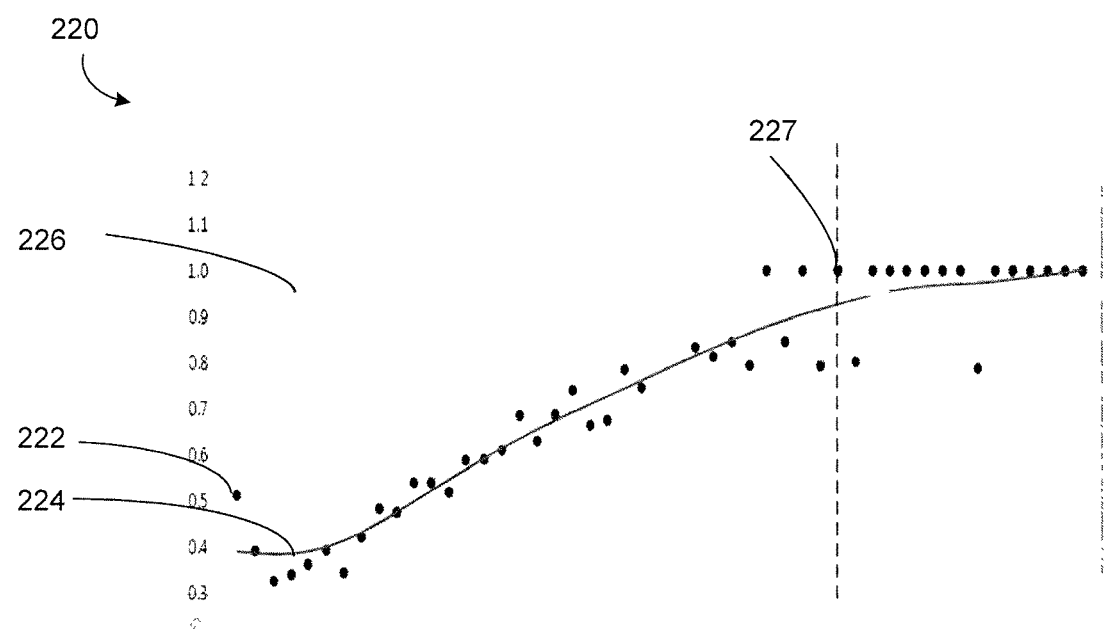
FIG. 2B illustrates results of a regression process in accordance with aspects of the present disclosure.

Given a set of seasoning progress data for a process chamber, coefficients for the MVA model described above can be computed from the seasoning progress data using regression. FIG. 2B is a graph 220 illustrating results of an exemplary regression process in accordance with aspects of the present disclosure. In FIG. 2B, the vertical axis indicates a seasoning index representing a progress of the seasoning operation and the horizontal axis indicates a sequential order of substrates processed during the seasoning operation. As an example, about 47 data points 222 are plotted on the graph 220. Each data point 222 represents normalized seasoning progress data $\{R_1, R_2, \ldots R_i\}$ for each substrate of the first plurality of substrates during a seasoning operation.

A curve 224 is a plot of the logistic equation based on regression by the MVA model using the normalized parameter values $x_{i,j}$ for each substrate of the first plurality of substrates. The set of coefficients $c_{k,j}$ can be determined by performing various regression techniques on the logistic equation. The model of $y_i$ may be used to minimize the squared error of the data points 222 relative to the curve 224.

In one embodiment, which can be combined with one or more embodiments described above, the least squares regression method may be adopted to fit the curve 224 to the normalized seasoning progress data $\{R_1, R_2, \ldots R_i\}$. The least squares regression method seeks to minimize the sum of the squares of the errors between each output of the logistic equation $\{S_1, S_2, \ldots S_i\}$ and each of the seasoning progress data $\{R_1, R_2, \ldots R_i\}$.

A substantially horizontal dashed line 226 indicates a threshold seasoning index at which the chamber is considered fully seasoned. As illustrated, the dashed line 226 is plotted at the seasoning index of about 0.95. However, other indices such as 0.85, 0.9, or 0.97 can be used for the threshold seasoning index.

Referring back to FIG. 2A, the MVA model regressor 214 performs regression analysis of the set of coefficients to fit the seasoning progress data to the logistic equation. The MVA model regressor 214 fits the respective seasoning indices $S_i$ to the corresponding seasoning progress data $R_i$ for each substrate number, i, to determine the set of coefficients $\{c_{k,j}\}$.

In one embodiment, which can be combined with one or more embodiments described above, the MVA model regressor 214 employs a support vector machine (SVM) model, which is a machine learning algorithm that analyzes data for classification and regression analysis. The SVM model can determine the set of coefficients that minimizes the errors between outputs by adjusting a position of a hyperplane to have a maximum margin from vectors of the seasoning indices. In another embodiment, which can be combined with one or more embodiments described above, the MVA model regressor 214 employs a least square fit method to determine the set of coefficients $\{c_{k,j}\}$ that minimize a least-square error between respective seasoning indices $S_i$ and corresponding seasoning progress data $R_i$ for each substrate, i. In another embodiment, which can be combined with one or more embodiments described above, the MVA model regressor 214 employs another suitable regression model, such as a linear regression or a polynomial regression to determine the set of coefficients that minimizes the errors.

Once the set of coefficients $\{c_{k,j}\}$ are determined, the MVA analyzer 216 stores a polynomial equation, $y_i = c_0 + \Sigma_j c_{i,j} x_{i,j}$, and generates seasoning indices $S_i$ for each substrate by applying the outputs of the polynomial equation to the logistic equation. In one embodiment, which can be combined with one or more embodiments described above, the MVA analyzer 216 can determine an end point of the seasoning operation based on the seasoning indices $S_i$.

The sensor interface 206 receives a plurality of substantially real-time parameter values from the plurality of sensors when processing each substrate of a second plurality of substrates. The substantially real-time parameter values may be obtained from various sensors of the plurality of sensors, depending on the seasoning process performed. To compare the sensing data (i.e., parameter values) of the second plurality of substrates to historical sensing data, as described above, the substantially real-time parameter values include the same types of sensing parameter values as the historical parameter values.

The substantially real-time parameter values are provided to the sensing data normalizer 210 for normalization. The sensing data normalizer 210 normalizes the plurality of substantially real-time parameter values as described above. The normalized real-time sensing data for each substrate of the second plurality of substrates are provided to the MVA analyzer 216. The MVA analyzer 216 applies the normalized real-time sensing data to the polynomial equation, $y_i = c_0 + \Sigma_j c_{i,j} x_{i,j}$, to determine the outputs, $y_i$. The MVA analyzer 216 enters the outputs of the polynomial equation into the logistic equation to produce seasoning indices for each substrate of the second plurality of substrates.

In one embodiment, which can be combined with one or more embodiments described above, the MVA analyzer 216 detects an end point of the seasoning process based on whether the seasoning indices for the second plurality of substrates meet criteria for completion of the seasoning process. The criteria for completion of the seasoning process may be an arbitrary number of substrates with seasoning indices above an arbitrary threshold. For example, the arbitrary number of substrates can be 3 and the arbitrary threshold seasoning index can be 0.95. That is, at least 3 substrates need to have seasoning indices higher than 0.95 to indicate that the seasoning process is complete.

For example, suppose that FIG. 2B illustrates a seasoning operation being performed on the second plurality of substrates and that the criteria for completion of the seasoning process has already been determined. The data point 227, representing a seasoning index for the thirty-third (33rd) substrate of the second plurality of substrates processed during the seasoning operation, is the third substrate with a seasoning index higher than the threshold 226 of 0.95. Thus, the data point 227 indicates that upon completion of processing the thirty-third substrate, the seasoning process for the chamber is complete. Thus, the MVA analyzer 216 can detect an end point of the seasoning process at the completion of processing the thirty-third substrate. Of course, the criteria for completion of the seasoning process can be any number of substrates with a seasoning index above any arbitrary threshold.

Figure 3:
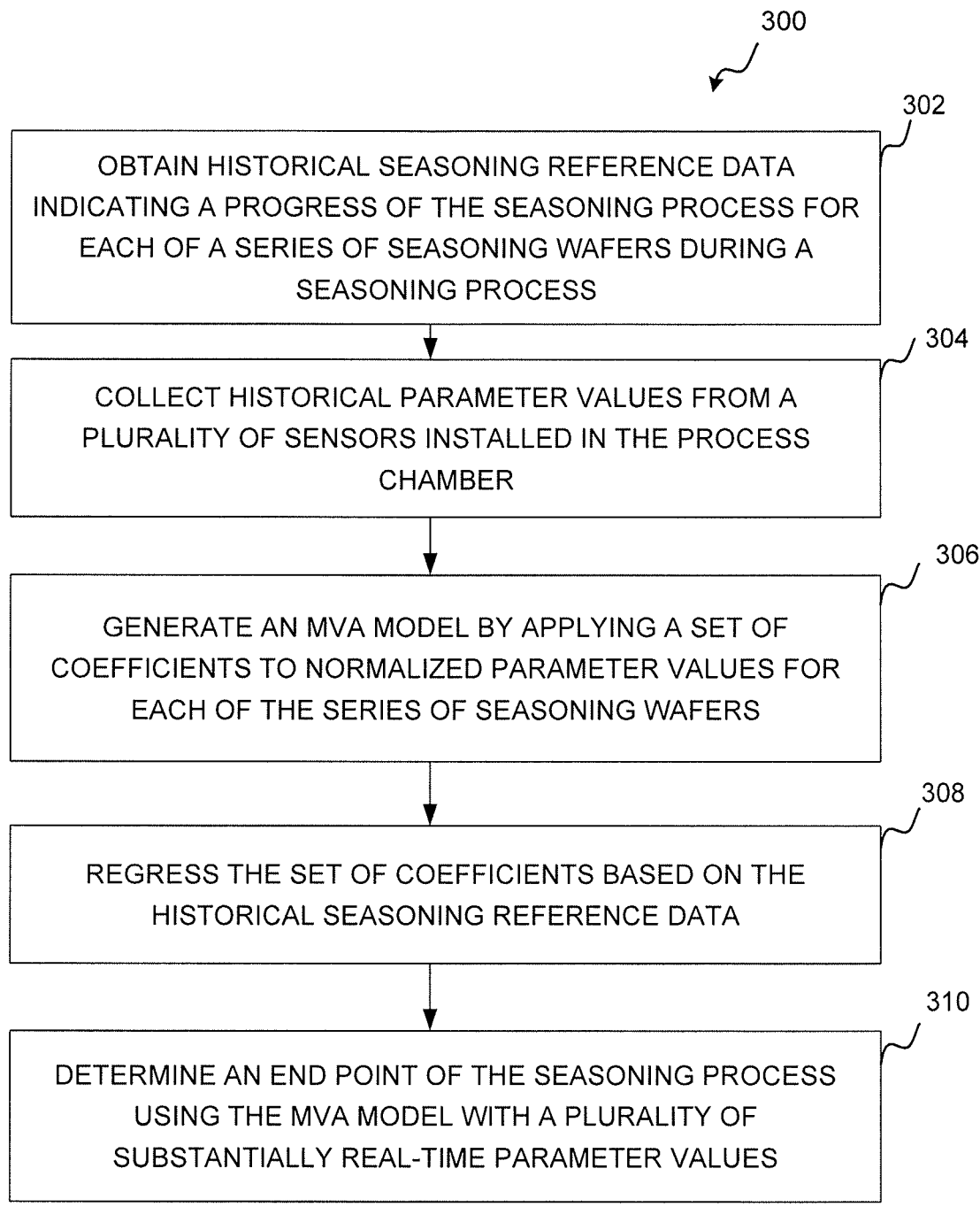
FIG. 3 is a flowchart for a method of detecting an endpoint of the seasoning process in accordance with aspects of the present disclosure.

FIG. 3 illustrates a method 300 for detecting an endpoint of the seasoning process in accordance with aspects of the present disclosure. The method begins at operation 302 where a process control system for controlling the seasoning operation obtains seasoning progress data for each substrate of a first plurality of substrates. The seasoning progress data may indicate a progress of a previously performed seasoning process. The seasoning progress data can include sensing values obtained from sensors in the process chamber or calculated values obtained based on the sensing values.

The seasoning progress data may be normalized with respect to seasoning data measured while the process chamber operated in a fully seasoned state prior to cleaning of the process chamber. The process control system may be directly or remotely coupled to the process chamber in which the seasoning process is performed.

At operation 304, the process control system obtains historical parameter values measured using a plurality of sensors installed in the process chamber. The parameter values used to determine progress of a seasoning operation for a particular process chamber may depend on the process performed in that chamber. That is, if a collection of parameter values exists for a particular process chamber, a subset of those parameter values may correspond to a particular seasoning process performed in that process chamber. Another subset of parameter values may correspond to a different seasoning process for that chamber. Thus, the parameter values selected to determine a status of seasoning the process chamber may be based on the particular process performed therein.

The process control system selects and activates a plurality of sensors in the process chamber to use in monitoring the seasoning operation. The plurality of sensors selected for monitoring may depend on the type of seasoning process performed. The process control system derives a plurality of parameter values for each substrate of the first plurality of substrates processed during the seasoning process from sensing data captured by the selected plurality of sensors. Subsequently, the process control system normalizes parameter values of the plurality of parameter values for each substrate with respect to corresponding parameter values associated with a particular substrate of the first plurality of substrates, such as the second substrate. In another embodiment, which can be combined with one or more embodiments described above, the particular substrate can be one of the first, third, fourth, or higher order substrate processed in the process chamber.

At operation 306, the process control system generates a multi-variate analysis (MVA) model using the normalized parameter values. In one embodiment, which can be combined with one or more embodiments described above, the MVA model can be a polynomial equation which is obtained by applying a set of coefficients to the normalized parameter values for each substrate of the first plurality of substrates. Outputs of an MVA model generator may be outputs of the polynomial equations for each substrate of the first plurality of substrates. The outputs of the MVA model generator are utilized as inputs to a logistic equation which results in an output of a seasoning index. The seasoning index indicates progress of the seasoning process. Each seasoning index is a function of the set of coefficients.

At operation 308, the MVA model is regressed with respect to the normalized seasoning progress data. The regression may be applied using various regression algorithms such that a sum of errors is minimized between outputs of the logistic equation and the seasoning progress data. In one embodiment, which can be combined with one or more embodiments described above, a support vector machine (SVM) model may be employed to determine the set of coefficients that minimizes the errors by adjusting a position of a hyperplane to have a maximum margin from vectors of the reference data. In another embodiment, which can be combined with one or more embodiments described above, the MVA model may be regressed using other suitable regression models, such as a linear regression or a polynomial regression to determine the set of coefficients that minimizes the errors.

At operation 310, the process control system receives and normalizes a plurality of substantially real-time parameter values from the plurality of sensors while processing each substrate of the second plurality of substrates. The normalized sensing data from operation 304 is provided to the MVA model. The outputs of the MVA model are entered into the logistic equation, which yields seasoning indices for each substrate of the second plurality of substrates. The system detects an end point of the seasoning process based on criteria for the completion of seasoning process. The criteria may be a number of substrates of the second plurality of substrates with a seasoning index above a threshold.

Figure 4:
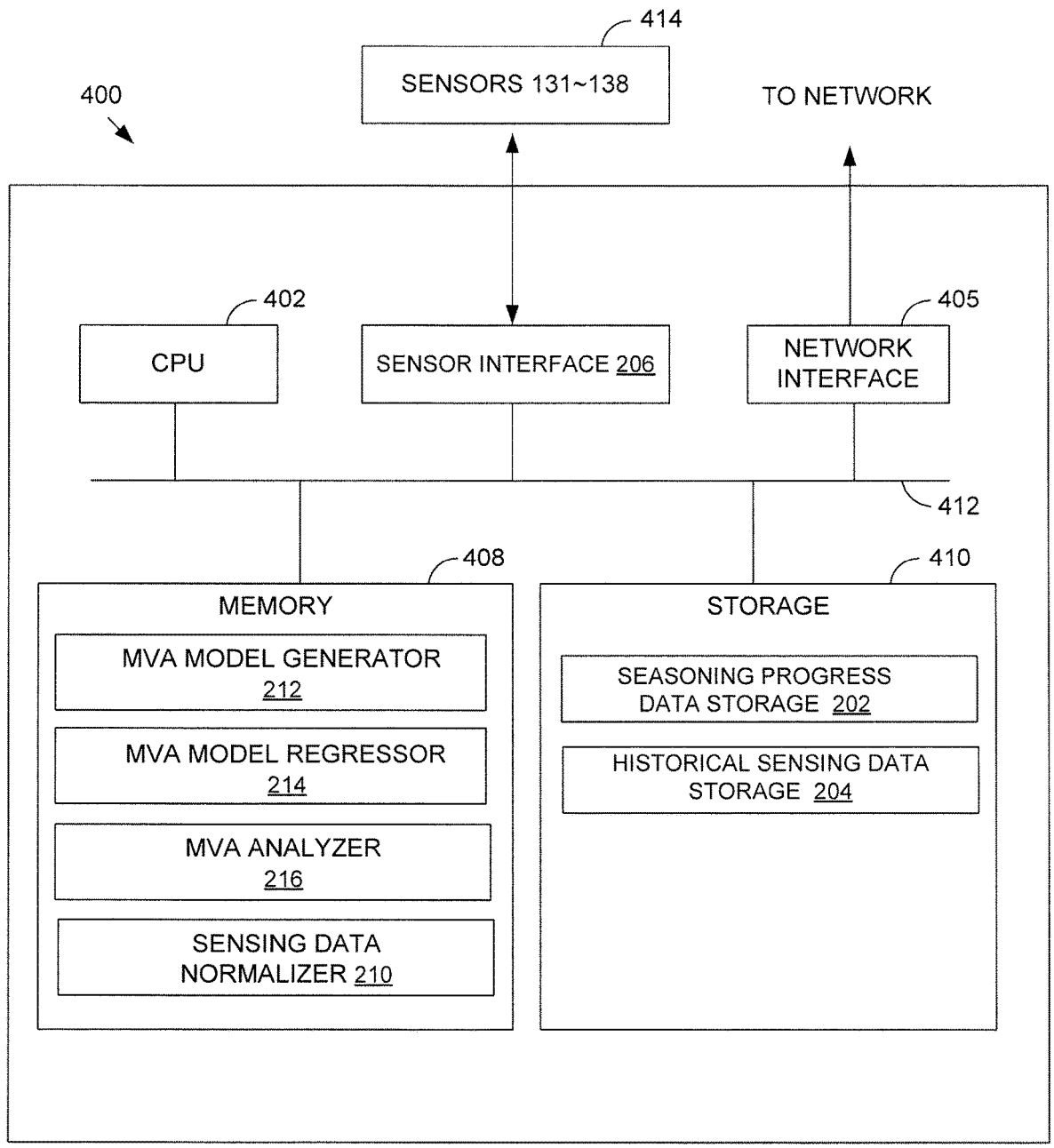
FIG. 4 illustrates an exemplary configuration of a process control system in accordance with aspects of the present disclosure.

FIG. 4 illustrates a configuration of a process control system 400 configured to implement methods described herein, such as the method 300 of detecting an end point of a seasoning process, discussed above with respect to FIG. 3.

As shown, the process control system 400 includes: a central processing unit (CPU) 402 for executing programming instructions; a sensor interface 206 which may allow for the connection of various sensors; a network interface 405, which may include, for example, a transceiver for transmitting and receiving data from an external network; a memory 408, such as a volatile random access memory; a storage 410, such as a non-volatile disk drive, RAID array, etc.; and an interconnect 412, such as a data bus. In some examples, some or all of the storage 410 may be remote from the process control system 400 and may instead be accessed via the network interface 405.

The CPU 402 retrieves and executes executable instructions stored in memory 408 via interconnect 412. As shown, the memory 408 includes the MVA model generator 212, the MVA model regressor 214, the MVA analyzer 216, and the sensing data normalizer 210. These components correspond to the components of the process control system 200 described with respect to FIG. 2A. The memory 408 includes program code for implementing these components.

The CPU 402 also retrieves and processes data from the storage 410. The storage 410 includes the seasoning progress data storage 202 and historical sensing data storage 204, as described with respect to FIG. 2A.

The preceding description is provided to enable any person skilled in the art to practice the various embodiments described herein. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. Also, features described with respect to some embodiments or examples may be combined in some other embodiments or examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, the term "determine" or "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determine" or "determining" may include resolving, selecting, choosing, establishing, and the like.

The methods disclosed herein include one or more operations or actions for achieving the methods. The operations and/or actions may be interchanged with one another without departing from the scope of the claims. In other words, unless a specific order of operations or actions is specified, the order and/or use of specific operations and/or actions may be modified without departing from the scope of the claims. Further, the various operations described herein may be performed by any suitable means capable of performing the corresponding functions. The means may include various hardware and/or software component(s) and/or module(s), including, but not limited to a circuit, an application specific integrated circuit (ASIC), or a processor.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for." All structural and functional equivalents to the elements of the various aspects described throughout this disclosure that are known or later come to be known to those of ordinary skill in the art are expressly incorporated herein by reference and are intended to be encompassed by the claims.

While the foregoing is directed to embodiments of the present disclosure, other and further embodiments of the disclosure may be devised without departing from the basic scope thereof, and the scope thereof is determined by the claims that follow.

What is claimed:

1. An apparatus for detecting an end point of seasoning process, the apparatus comprising:
   a process chamber;
   a set of sensors coupled to the process chamber;
   at least one storage configured to store:
      seasoning progress data indicating a progress of at least one seasoning process for each substrate of a first plurality of substrates; and
      historical parameter values measured from a plurality of sensors selected from the set of sensors when processing each substrate of the first plurality of substrates during the seasoning process; and
   a controller configured to:
      normalize the historical parameter values for each substrate of the first plurality of substrates with respect to a plurality of the historical parameter values for a particular substrate of the first plurality of substrates;
      generate a multi-variate analysis (MVA) model by applying a set of coefficients to the normalized historical parameter values for each substrate of the first plurality of substrates;
      determine the set of coefficients by performing a regression operation on output values of a logistic equation, where inputs of the logistic equation are outputs of the MVA model, with the normalized historical parameter values for each substrate of the first plurality of substrates;
      receive a plurality of substantially real-time parameter values from the plurality of sensors when processing a second plurality of substrates; and
      determine an end point of the seasoning process using the MVA model with the plurality of substantially real-time parameter values.

2. The apparatus of claim 1, wherein when the process chamber is configured to perform an etch process and the seasoning progress data includes at least one of an etch rate, an etch selectivity, or an undercut factor.

3. The apparatus of claim 1, wherein the controller is further configured to select the plurality of sensors from the set of sensors to collect parameter values depending on a process performed in the process chamber.

4. The apparatus of claim 1, wherein the logistic equation is:

$$S_i = \left(\frac{1}{1+e^{-y_i}} - 0.5\right),$$

wherein $y_i$ is an output of the MVA model for an i-th substrate and $S_i$ is a seasoning index indicating a progress of the seasoning process when processing the i-th substrate.

5. The apparatus of claim 1, wherein the regression operation is a least squares regression that minimizes a sum of squares of errors between outputs of the logistic equation and each of the seasoning progress data.

6. The apparatus of claim 1, wherein the regression operation is a support vector machine (SVM) regression that adjusts a position of a hyperplane to have a maximum margin from vectors of the seasoning progress data.

7. The apparatus of claim 4, wherein the controller is further configured to detect the end point of the seasoning process when the seasoning index for a particular number of substrates of the second plurality of substrates satisfies a threshold.

8. A method for detecting an endpoint of a seasoning process in a process chamber, the method comprising:
   obtaining seasoning progress data indicating a progress of a seasoning process for each substrate of a first plurality of substrates;
   obtaining historical parameter values measured from a plurality of sensors selected from a set of sensors coupled to a process chamber when processing each substrate of the first plurality of substrates;
   normalizing the historical parameter values for each substrate of the first plurality of substrates with respect to a plurality of the historical parameter values for a particular substrate of the first plurality of substrates;
   generating a multi-variate analysis (MVA) model by applying a set of coefficients to the normalized historical parameter values for each substrate of the first plurality of substrates;
   determining the set of coefficients by performing a regression operation on outputs of a logistic equation, where inputs of the logistic equation are outputs of the MVA model, with the normalized historical parameter values for each substrate of the first plurality of substrates;
   receiving a plurality of substantially real-time parameter values from the plurality of sensors when processing each substrate of a second plurality of substrates; and
   determining an end point of the seasoning process using the MVA model with the plurality of substantially real-time parameter values.

9. The method of claim 8, wherein when the process chamber is configured to perform an etch process and the seasoning progress data includes at least one of an etch rate, an etch selectivity, or an undercut factor.

10. The method of claim 8, further comprising selecting the plurality of sensors among the set of sensors to collect depending on a type of a process that the process chamber performs.

11. The method of claim 8, wherein the regression operation is a least squares regression that minimizes a sum of squares of errors between each output of the logistic equation and each of the seasoning progress data, respectively.

12. The method of claim 8, wherein the regression operation is a support vector machine (SVM) regression that adjusts a position of a hyperplane to have a maximum margin from vectors of the seasoning progress data.

13. The method of claim 8, wherein the logistic equation is:

$$S_i = \left(\frac{1}{1+e^{-y_i}} - 0.5\right),$$

wherein $y_i$ is an output of the MVA model for an i-th substrate, and $S_i$ is a seasoning index indicating a progress of the seasoning process when processing the i-th substrate.

14. The method of claim 13, further comprising detecting the end point of the seasoning process when the seasoning index of a particular number of substrates of the second plurality of substrates satisfies a threshold.

15. A method for detecting an endpoint of a seasoning process, the method comprising:
obtaining seasoning progress data indicating a progress of a seasoning process for each substrate of a first plurality of substrates;
obtaining historical parameter values measured from a subset of a plurality of sensors coupled to a process chamber, each sensor in the plurality of sensors measuring a parameter of the seasoning process when processing each substrate of the first plurality of substrates;
normalizing the historical parameter values with respect to a subset of the historical parameter values associated with a particular substrate of the first plurality of substrates;
normalizing the seasoning progress data for each substrate of the first plurality of substrates with respect to seasoning progress data associated with a completed seasoning process;
generating a multi-variate analysis (MVA) model by applying a coefficient to each normalized historical parameter values for the first plurality of substrates, wherein the coefficients are determined by performing a regression operation on a plurality of outputs of a logistic equation, where inputs of the logistic equation are outputs of the MVA model;
receiving a plurality of substantially real-time parameter values from the subset of sensors when processing each substrate of a second plurality of substrates; and
determining an end point of the seasoning process using the MVA model with the plurality of substantially real-time parameter values.

16. The method of claim 15, wherein the subset of the plurality of sensors is selected based on a type of process performed in the process chamber.

17. The method of claim 15, wherein the regression operation is a support vector machine (SVM) regression that adjusts a position of a hyperplane to have a maximum margin from vectors of the seasoning progress data.

18. The method of claim 15, wherein the logistic equation is:

$$S_i = \left(\frac{1}{1+e^{-y_i}} - 0.5\right),$$

wherein $y_i$ is an output of the MVA model for an i-th substrate, and $S_i$ is a seasoning index indicating a progress of the seasoning process when processing the i-th substrate.

19. The method of claim 18, wherein the regression operation is a least squares regression that minimizes a sum of squares of errors between the seasoning index for each substrate of the second plurality of substrates and each of the seasoning progress data.

20. The method of claim 18, further comprising detecting the end point of the seasoning process when the seasoning index of a particular number of substrates of the second plurality of substrates satisfies a threshold.

* * * * *